(12) United States Patent
Wood et al.

(10) Patent No.: US 8,062,958 B2
(45) Date of Patent: Nov. 22, 2011

(54) MICROELECTRONIC DEVICE WAFERS AND METHODS OF MANUFACTURING

(75) Inventors: Alan G. Wood, Boise, ID (US); Ed A. Schrock, Boise, ID (US); Ford B. Grigg, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 12/416,609

(22) Filed: Apr. 1, 2009

(65) Prior Publication Data

US 2010/0252915 A1   Oct. 7, 2010

(51) Int. Cl.
   *H01L 21/30* (2006.01)
(52) U.S. Cl. ........ 438/459; 257/E21.237; 438/959
(58) Field of Classification Search ........ 257/E21.237; 438/459, 959
   See application file for complete search history.

(56) References Cited

U.S. PATENT DOCUMENTS

| | | | |
|---|---|---|---|
| 5,674,785 A | 10/1997 | Akram et al. | |
| 5,739,585 A | 4/1998 | Akram et al. | |
| 7,098,152 B2 | 8/2006 | Moore | |
| 7,169,691 B2 | 1/2007 | Doan | |
| 7,332,413 B2 | 2/2008 | Kirby | |
| 7,507,638 B2 * | 3/2009 | Mancini et al. | 438/459 |
| 2003/0020062 A1 | 1/2003 | Faris | |
| 2003/0143819 A1 | 7/2003 | Hedler et al. | |
| 2006/0003255 A1 | 1/2006 | Wood et al. | |
| 2008/0014679 A1 | 1/2008 | Shen et al. | |
| 2008/0242052 A1 * | 10/2008 | Feng et al. | 438/459 |

OTHER PUBLICATIONS

Taiko Process, Disco Corporation, retrieved from the Internet on Feb. 23, 2009, <http:www.disco.co.jp/eg/solution/library/taiko.html>.
Kallender, P., "Fujitsu sculpts ultra-thin wafers for multichip packs," EE Times, Dec. 4, 2001.

* cited by examiner

*Primary Examiner* — Asok Sarkar
(74) *Attorney, Agent, or Firm* — Perkins Coie LLP

(57) ABSTRACT

Methods of forming microelectronic device wafers include fabricating a plurality of semiconductor dies at an active side of a semiconductor wafer, depositing a mask on the semiconductor wafer, removing a central portion of the mask and the semiconductor wafer, and etching. The semiconductor wafer has an outer perimeter edge and a backside that is spaced from the active side by a first thickness. The mask is deposited on the backside of the semiconductor wafer and has a face that is spaced from the backside by a mask thickness. The thinned portion has a thinned surface that is spaced from the active side by a second thickness that is less than the first thickness, and the thinned surface is etched.

26 Claims, 7 Drawing Sheets

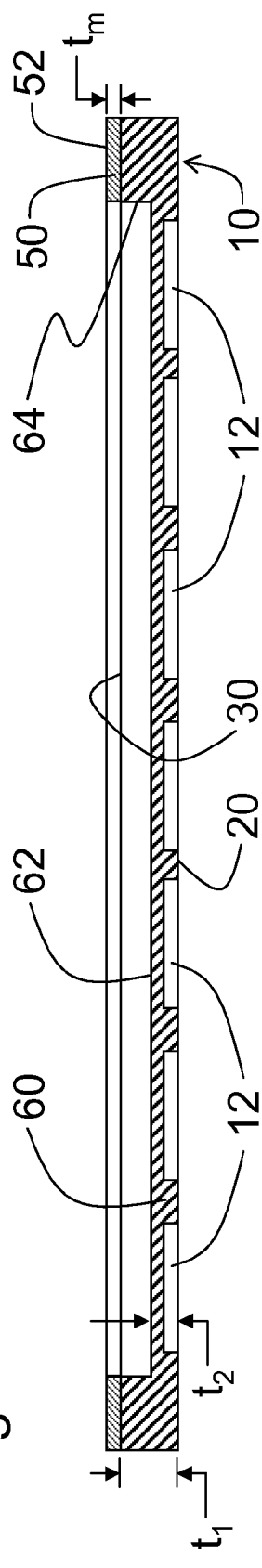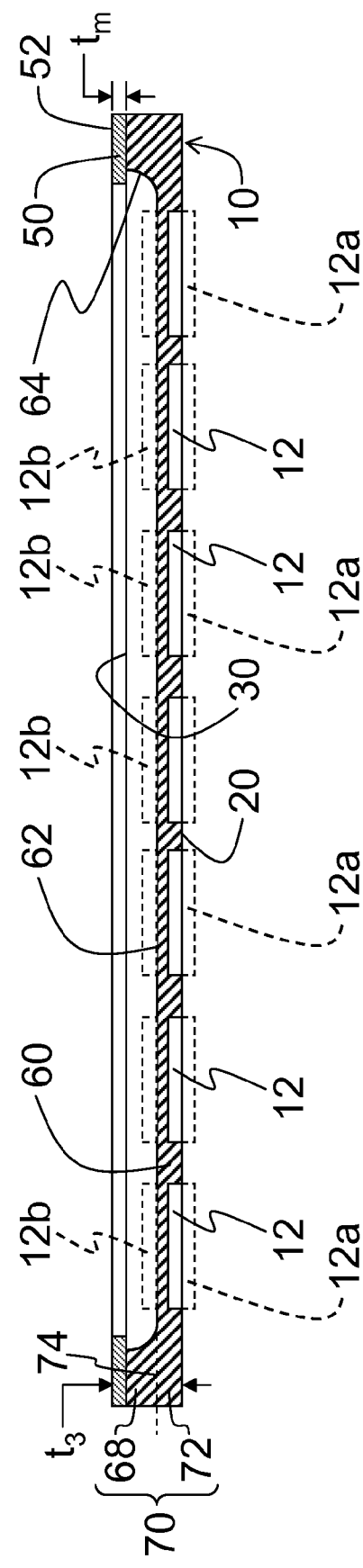

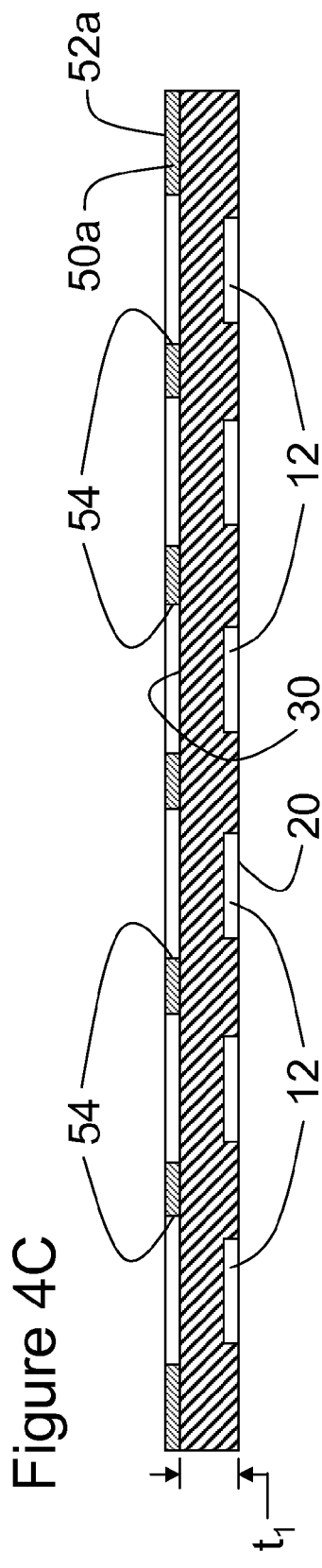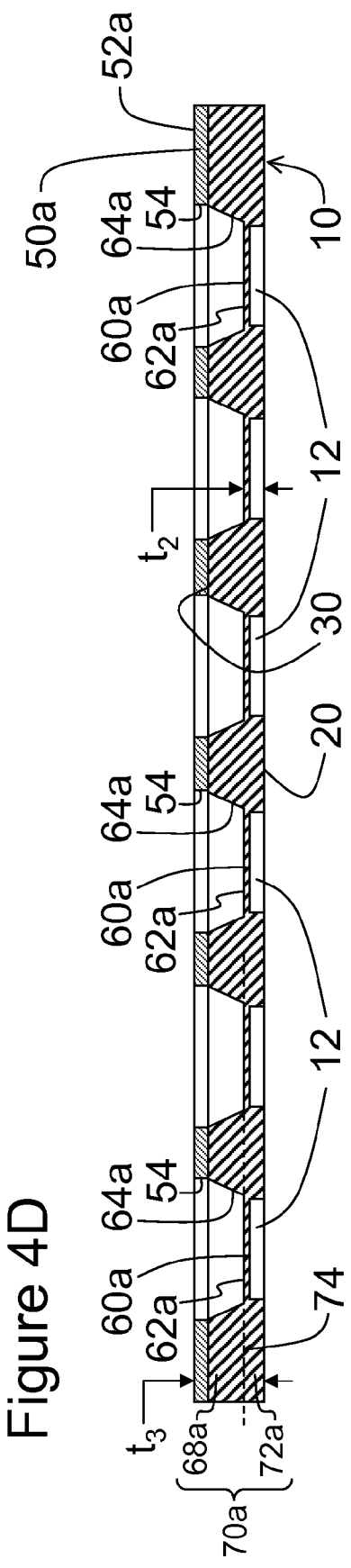

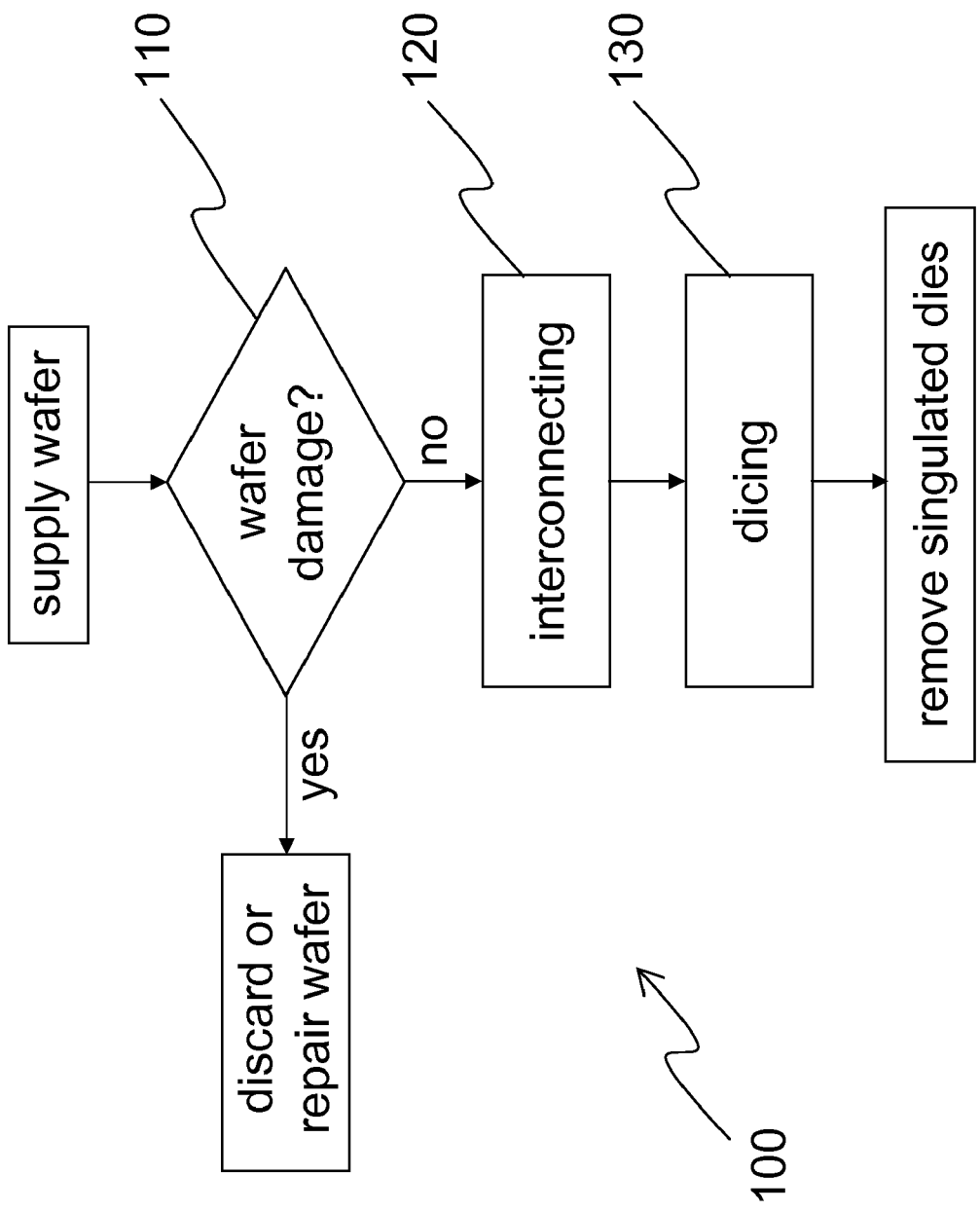

MICROELECTRONIC DEVICE WAFERS AND METHODS OF MANUFACTURING

TECHNICAL FIELD

The present disclosure is related to microelectronic device wafers, such as a semiconductor wafer, and methods of manufacturing such wafers. In particular, the present disclosure relates to semiconductor wafers including a thinned portion and a structure supporting the thinned portion.

BACKGROUND

Microelectronic devices, such as processors, memory devices and imagers, are manufactured on and/or in semiconductor wafers made from silicon, gallium arsenide or other semiconductive materials. In a typical application a large number of individual dies are manufactured on each wafer. Operating these microelectronic devices can, however, generate large amounts of heat. Accordingly, it is desirable to remove the heat to avoid failure or performance degradation of the microelectronic device due to excessive temperatures or a deleterious thermal environment. The electronic products in which the dies are used, such as cell phones, notebook/laptop computers, personal digital assistants and the like, often have dimensional constraints, performance parameters (e.g., optimizing transmission line performance), and manufacturing considerations (e.g., reducing depths of through-holes).

One way to increase heat transfer from a microelectronic device and address dimensional, performance and manufacturing considerations is to thin the wafers on which the devices are fabricated. Wafer thinning techniques have accordingly been developed in response to an ever-increasing demand for smaller-sized, higher-performance microelectronic devices. Microelectronic devices can be thinned while the devices are in a wafer form or structure (e.g., before dicing or singulation) by etching or back grinding material from the backside of the wafer from full thickness (e.g., 750-775 µm) to a final thickness (e.g., less than 150 µm). Semiconductor wafers are fragile at full thickness and even more fragile at final thickness. Semiconductor wafers accordingly require specialized handling during and after the thinning operation.

Additionally, the high cost of microelectronic device handling equipment makes it desirable to use a single form factor to handle full-thickness and thinned microelectronic wafers. However, many conventional semiconductor fabrication, packaging and test processes currently use tools with one form factor for full-thickness microelectronic wafers and another form factor for post-thinning processes. This prevents certain tools from being used to process either full-thickness or thinned wafers, which in turn impacts the utilization of such tools.

One conventional approach for handling semiconductor wafers is to mount the wafers on a support layer or another support structure before thinning. The support structure, alone or in combination with the microelectronic wafer structure itself, provides sufficient structural support for handling semiconductor wafers. The combined thickness of the support structure and the thinned wafer can be substantially similar to a full thickness wafer. This facilitates handling without altering the existing microelectronic device handling equipment.

Conventional methods and systems for supporting wafers during and after thinning have several drawbacks. In most conventional applications a support structure is affixed to a microelectronic wafer by coating a face of the wafer and/or the support structure with an adhesive and bonding the support structure to the microelectronic wafer. The adhesive may, however, increase the potential for contaminating the process area. The adhesive also limits the processing temperatures of subsequent processes because the microelectronic wafer and support structure cannot be exposed to processing temperatures above the melting temperature of the adhesive. Other considerations may include warping or bowing of the microelectronic wafer because of different coefficients of thermal expansion or stress states between the microelectronic wafer and the conventional support structure as the wafer and/or support structure is heated and cooled in subsequent processes. Therefore, conventional methods and systems for supporting wafers may have serious drawbacks.

BRIEF DESCRIPTION OF THE DRAWINGS

FIG. 3C is a schematic cross-section view of a semiconductor wafer showing yet another stage of the method in accordance with the second embodiment of the present disclosure.

FIG. 3D is a schematic cross-section view of a semiconductor wafer showing still yet another stage of the method in accordance with the second embodiment of the present disclosure.

FIG. 4C is a schematic cross-section view of a semiconductor wafer showing yet another stage of the method in accordance with the third embodiment of the present disclosure.

FIG. 4D is a schematic cross-section view of a semiconductor wafer showing still yet another stage of the method in accordance with the third embodiment of the present disclosure.

FIG. 5 is a flow chart showing a process using a wafer in accordance with embodiments of the present disclosure.

DETAILED DESCRIPTION

Specific details of several embodiments of the disclosure are described below with reference to microelectronic device wafers and methods for manufacturing such wafers. The microelectronic devices can include, for example, micromechanical components, data storage elements, optics, read/write components, or other features. The microelectronic dies can be flash memory (e.g., NAND flash memory), SRAM, DRAM (e.g., DDR-SDRAM), processors, imagers, and other types of devices. Other embodiments of the disclosure can have configurations, components, features or procedures different than those described in this section. A person of ordinary skill in the art, therefore, will accordingly understand that the disclosure may have other embodiments with additional elements, or the disclosure may have other embodiments without several of the elements shown and described below with reference to FIGS. 1 to 5.

Figure 1:
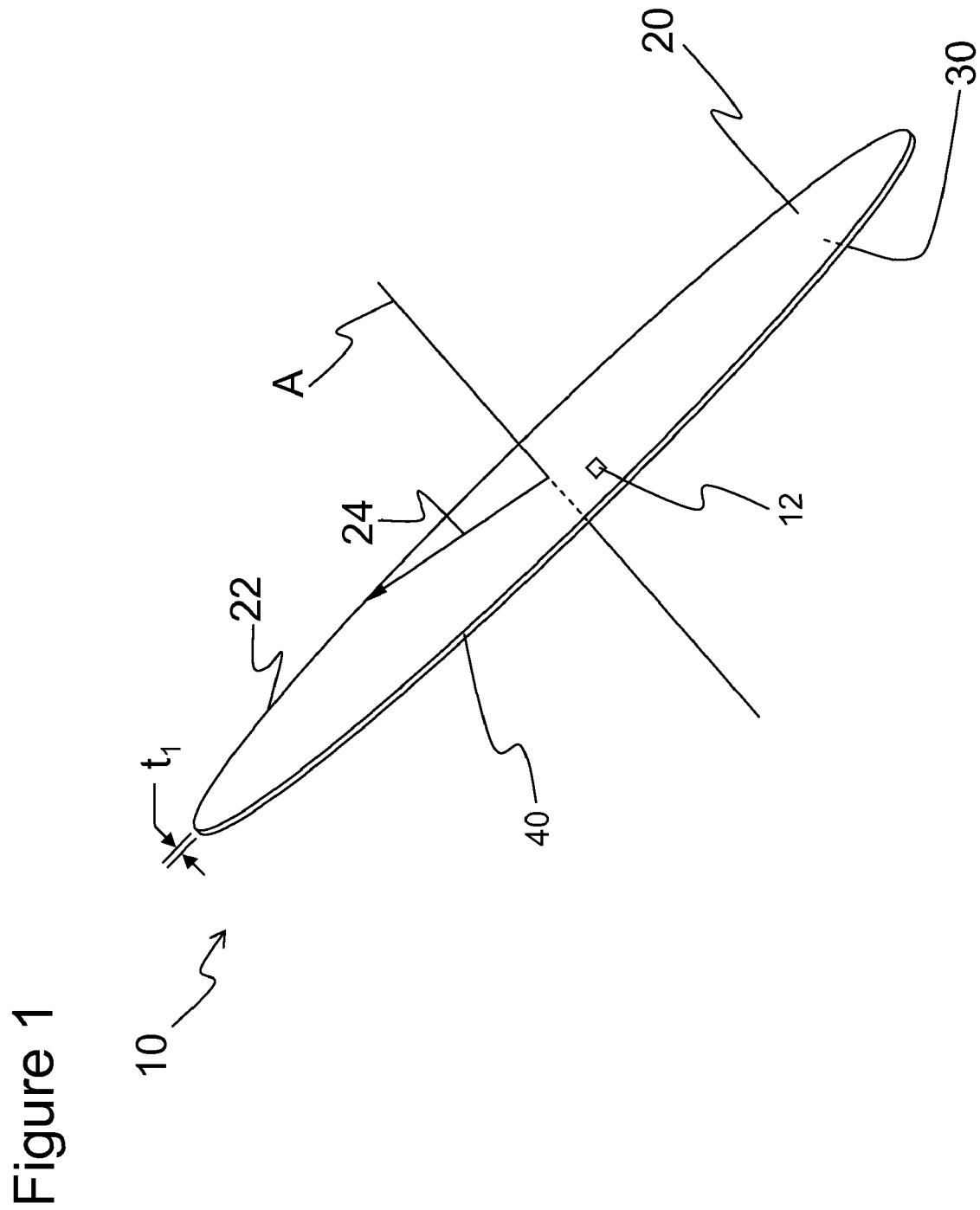
FIG. 1 is a schematic perspective view of a semiconductor wafer before processing in accordance with embodiments of the present disclosure.

FIG. 1 is a schematic perspective view of a semiconductor wafer 10 or other microelectronic device wafer before processing in accordance with embodiments of the present disclosure. The wafer 10 is typically a single crystalline silicon structure but it can be made from any suitable wafer material. The wafer 10 can include a first side 20, a second side 30 spaced from the first side 20 by a first thickness $t_1$ along an axis A, and an outer perimeter edge 40 that extends between the first and second sides 20 and 30. In the embodiment shown in FIG. 1, the first side 20 is approximately circular with a perimeter 22 defined by a first radius 24 from the axis A. The second side 30 can be approximately parallel to the first side 20. According to other embodiments, the first and second sides 20 and 30 can have any regular or irregular shape and can be obliquely oriented with respect to one another. The wafer 10 can further include a plurality of dies 12 with integrated circuits, bond pads and other features (only one is shown in FIG. 1). The first side 20 can be, for example, a front side or active side of the wafer 10 where the dies are fabricated, and the second side 30 can be, for example, a backside or passive side of the wafer 10.

Figure 2A:
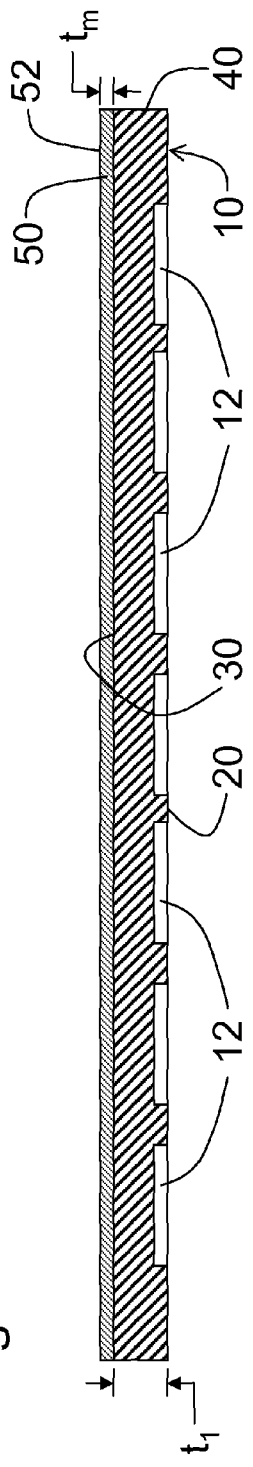
FIG. 2A is a schematic cross-section view of a semiconductor wafer showing a stage of a method in accordance with a first embodiment of the present disclosure.
Figure 2B:
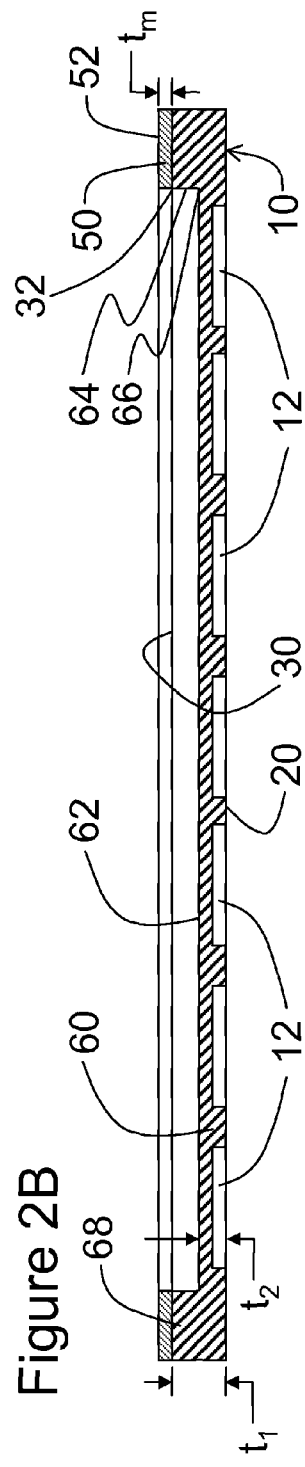
FIG. 2B is a schematic cross-section view of a semiconductor wafer showing another stage of the method in accordance with the first embodiment of the present disclosure.
Figure 2C:
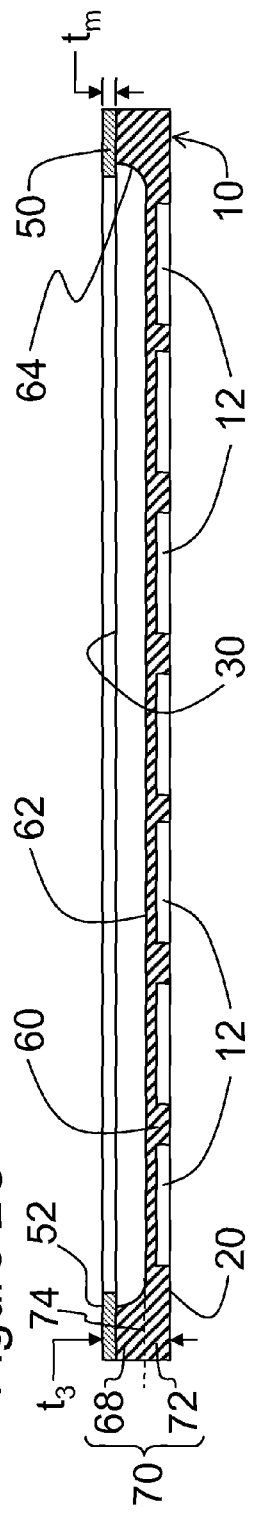
FIG. 2C is a schematic cross-section view of a semiconductor wafer showing yet another stage of the method in accordance with the first embodiment of the present disclosure.

FIGS. 2A to 2C illustrate stages of a method of manufacturing semiconductor devices in accordance with one embodiment of the present disclosure. FIG. 2A is a schematic cross-section view of a semiconductor wafer showing a stage of the method including applying a mask 50 to the second side 30 of the wafer 10. The mask 50 can include a mask face 52 spaced from the second side 30 by a mask thickness $t_m$. The mask 50 can be a hard mask material, e.g., nitride, or any suitable mask material, and it can be deposited by chemical vapor deposition or any suitable method.

According to other embodiments, the mask 50 can be applied to portions of the second side 30 by patterning the mask 50. For example, as an alternative to applying the mask 50 over all of the second side 30, a ring shaped mask 50 can be applied to the second side 30 near the outer perimeter edge 40.

FIG. 2B is a schematic cross-section view of a semiconductor wafer showing another stage including mechanically thinning the wafer 10 with the mask 50 applied to the second side 30. The central portions of the mask 50 and/or the wafer 10 can be removed using a mechanical removal process, such as grinding or another suitable mechanically abrasive process. One suitable mechanical removal process is the TAIKO process flow using a DAG810 grinder manufactured by DISCO Corporation, Japan. As shown in FIG. 2B, a portion of the mask 50 and a portion of the wafer 10 can be removed such that the wafer 10 has a thinned portion 60 with a thickness $t_2$ between the first side 20 and a thinned surface 62. The second thickness $t_2$ approximately corresponds to a desired final thickness of the thinned portion 60 for a plurality of semiconductor dies 12 fabricated on the first side 20, and the second thickness $t_2$ is generally significantly less than the first thickness $t_1$ of the wafer 10. In general, a 200 mm wafer can have a full-thickness of approximately 700-750 μm (e.g., 725 μm) and a 300 mm wafer can have a full-thickness of approximately 750-800 μm (e.g., 775 μm), and the thinned portion 60 of the wafer 10 can have a final thickness of less than 150 μm, or less than 100 μm, or less than 50 μm, or even approximately 25-40 μm (e.g. about 35 μm).

Continuing to refer to FIG. 2B, removing the central portion of the wafer 10 forms an annular inner surface 64, such as an annular wall, that extends between an outer boundary 66 of the thinned surface 62 and an inner boundary 32 at the second side 30. The first side 20 and the thinned surface 62 can be approximately circular such that the remaining portion of the second side 30 can be annular. The wafer 10 accordingly has an annular support region 68 that includes the remaining material of the second side 30 and the mask 50. The inner surface 64 can be formed with typical mechanically thinning tools, e.g., a grinder (not shown), and can be perpendicular to the thinned surface 60 and/or the second side 30.

FIG. 2C is a schematic cross-section view of a semiconductor wafer showing yet another stage of the method including etching portions of the thinned surface 62 and the inner surface 64. This etching process can smooth the thinned surface 62 to relieve stress in the thinned portion 60 and reshape the inner surface 64 to achieve a desired size and shape for the annular support region 68. The etching, which can be wet, dry, isotropic or anisotropic, can be delimited by the mask 50 and/or by the orientation of the crystalline structure of the wafer 10. In the embodiment shown in FIG. 2C, the silicon wafer material is etched isotropically such that material is removed at the same rate in all directions. Accordingly, the inner surface 64 of the example shown in FIG. 2C undercuts the mask 50. One suitable etchant is potassium hydroxide (KOH).

In other embodiments, different etchants can reshape the inner surface 64 differently. For example, an anisotropic etchant can etch a perpendicular inner surface 64 that is delimited by an inner boundary of the mask 50. In still other embodiments, an anisotropic etchant can etch the silicon wafer material at different rates in different vertical and lateral directions. Specifically, such directional etching proceeds along an exposed plane in the crystal lattice. As atoms are removed from the crystal lattice, different planes are exposed to the etchant. Since the density of atoms on the different planes varies, the etch rate in different directions varies. For example, an initial or zero degree surface of a silicon substrate is conventionally designated "100" and etches one hundred times faster than the 45 degree and 54 degree surfaces, which are conventionally designated "110" and "111," respectively. Such etching accordingly can produce an inner surface 64 that is obliquely oriented with respect to the thinned surface 60.

Selected embodiments of the foregoing methods can provide a robust frame to support the thinned portion of the wafer 10. Continuing to refer to FIG. 2C, a support portion 70 near the outer perimeter edge 40 of the thinned wafer 10 can include the annular support region 68 and a face region 72. The annular support region 68 extends between the mask face 52 and a plane 74. The plane 74 coincides with the thinned surface 62 and is a virtual plane as opposed to representing a separation or break in the wafer 10. The face region 72 extends between the first side 20 and the plane 74. Accordingly, the support portion 70 extends a third thickness $t_3$ between the first side 20 and the mask face 52.

According to embodiments of the present disclosure, a wafer can have a diameter of about 150-450 millimeters with a thinned portion 60 having a thickness less than about 100 μm. At the same time, the overall thickness of the support portion of the wafer can be about 750-775 μm. According to other embodiments of the present disclosure, the thinned portion of the wafer can have a thickness less than about 150 μm. Other embodiments of the present disclosure can have overall dimensions that are consistent with conventional wafer sizes, and still have a thinned portion that corresponds to the desired wafer thickness for a semiconductor die. In accordance with embodiments of the present disclosure, the thickness of the support portion can be selected so that the wafer handling machines use a single form factor for handling wafers with an overall thickness of about 750-775 μm for both the full-thickness and the thinned wafers.

Figure 3A:
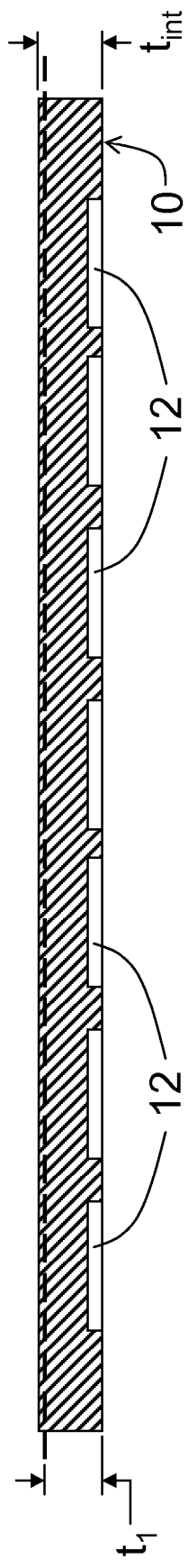
FIG. 3A is a schematic cross-section view of a semiconductor wafer showing a stage of a method in accordance with a second embodiment of the present disclosure.
Figure 3B:
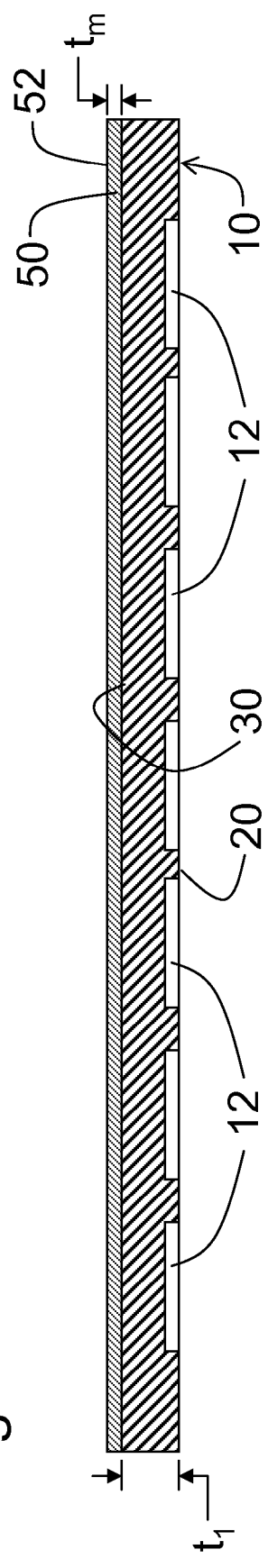
FIG. 3B is a schematic cross-section view of a semiconductor wafer showing another stage of the method in accordance with the second embodiment of the present disclosure.

FIGS. 3A to 3D illustrate stages of a method of manufacturing semiconductor devices in accordance with another embodiment of the present disclosure. FIG. 3A is a schematic cross-section view of a semiconductor wafer showing a stage of the method that includes thinning the wafer 10 before applying a mask 50 to the second side 30 of the wafer 10. FIGS. 3B to 3D are schematic cross-section views of a semiconductor wafer showing subsequent stages of the method that can be generally analogous to the stages of the method in accordance with the embodiment shown in FIGS. 2A to 2C.

With reference to FIG. 3A, the wafer 10 has an initial thickness $t_{int}$ and is thinned by back grinding or another suitable mechanical process to reduce the initial thickness $t_{int}$ of the wafer 10 to the first thickness $t_1$. The amount of back grinding of the initial thickness $t_{int}$ required to reach the first thickness $t_1$ can be determined based on a given thickness of the mask and the desired thickness of the support portion. For example, it may be desirable for the sum of the mask thickness and first thickness $t_1$ to equal the form factor thickness of the wafer handling equipment. Thus, for a given mask thickness, the thinned wafer thickness is determined as the difference between the support portion thickness and the mask thickness.

Selected embodiments can accordingly compensate for different thicknesses between wafer lots. More specifically, varying initial thicknesses of wafers can be corrected by back grinding as shown in FIG. 3A before depositing the mask 50 on the second side 30 of the wafer 10 (FIG. 3B), mechanically thinning a portion of the wafer 10 as shown in FIG. 3C, and etching the wafer 10 as shown in FIG. 3D.

Additional embodiments of the wafer 10 shown in FIGS. 3C and 3D can further enhance the process of forming stacked die configurations. For example, referring to FIG. 3D, additional singulated known-good-dies 12a (shown in dashed lines) can be stacked on the front side of known-good-dies 12 of the wafer 10, and/or singulated known-good-dies 12b (shown in dashed lines) can be stacked on the backside of the thinned portion 60 of the wafer 10 and electrically coupled to the known-good-dies 12 using through-silicon-vias. The number of stacked dies can be greater or less than the three dies 12, 12a and 12b shown in FIG. 3D. After stacking the dies, the stacked die configurations can be encapsulated at the wafer level before singulation, and then the individual packages can be singulated from each other.

Figure 4A:
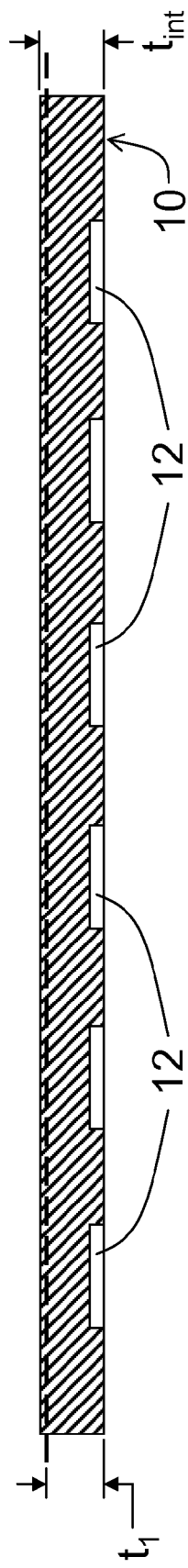
FIG. 4A is a schematic cross-section view of a semiconductor wafer showing a stage of a method in accordance with a third embodiment of the present disclosure.

FIGS. 4A to 4D illustrate stages of a method of manufacturing semiconductor devices in accordance with yet another embodiment of the present disclosure. FIG. 4A is a schematic cross-section view of a semiconductor wafer showing a stage of the method including back grinding a wafer 10 before applying a mask 50 to the wafer 10. Thus, FIG. 4A is generally analogous to the stage of the method shown in FIG. 3A. According to other embodiments, the first thickness $t_1$ of the wafer 10 can be provided without back grinding before applying a mask 50 to the wafer 10.

Figure 4B:
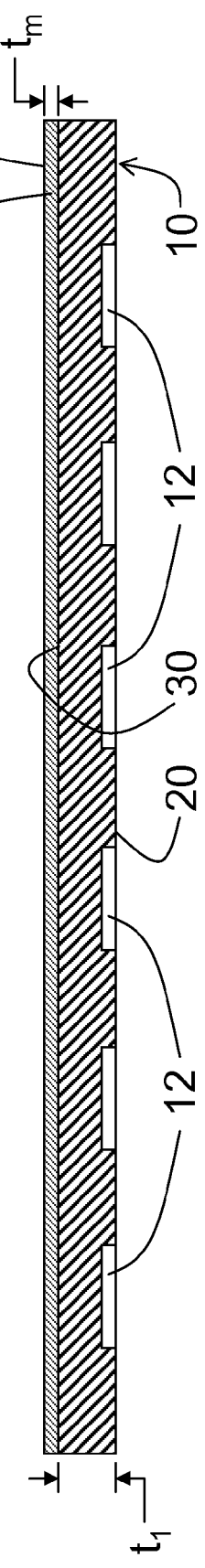
FIG. 4B is a schematic cross-section view of a semiconductor wafer showing another stage of the method in accordance with the third embodiment of the present disclosure.

FIG. 4B is a schematic cross-section view of a semiconductor wafer showing a subsequent stage that includes applying a mask 50a to the second side 30 of the wafer 10. Thus, the stage shown in FIG. 4B can be generally analogous to the stage of the method shown in FIG. 2A and the stage of the method shown in FIG. 3B.

FIG. 4C is a schematic cross-section view of a semiconductor wafer showing another stage including patterning the mask 50a to form a plurality of openings 54 in which individual openings are aligned with a corresponding die 12. The openings 54 can be formed by removing portions of the mask 50a using a photo-lithography technique and then etching from the backside of the wafer as known in the art. Individual openings 54 can be positioned over individual semiconductor dies 12 or positioned over a sub-group of the plurality of semiconductor dies 12. As shown in FIG. 4C, individual openings 54 reveal portions of the second side 30 aligned with individual semiconductor dies 12.

FIG. 4D is a schematic cross-section view of a semiconductor wafer showing a subsequent stage of the method that includes thinning individual portions of the semiconductor wafer 10. As shown in FIG. 4D, individual portions of the wafer 10 are removed to form individual thinned portions 60a that extend between the first side 20 and individual thinned surfaces 62a. The removal process generally includes an etching process that forms obliquely oriented inner surfaces 64a. Individual thinned portions 60a have a second thickness $t_2$ between the first face 20 and corresponding thinned surfaces 62a. The second thickness $t_2$ approximately corresponds to a desired final thickness of the thinned portions 60a for the plurality of semiconductor dies 12 fabricated on the first side 20, and is generally significantly less than the first thickness $t_1$ of the wafer 10. (See FIG. 4C) In general, the wafer 10 can have a full-thickness of approximately 750-775 μm and the thinned portions 60a of the wafer 10 can have a final thickness of less than 150 μm, or less than 100 μm, or even less than 50 μm.

The portion of the face 52a that remains after patterning the mask 50a forms a grid that also defines the support portion 70a of the etched wafer 10. As shown in FIG. 4D, a support portion 70a near the outer perimeter edge 40 of the thinned wafer 10 can include a grid-shaped support region 68a and a face region 72a. The grid-shaped support region 68a extends between the mask face 52a and a plane 74 that coincides with the thinned surfaces 62a. The plane 74 is a virtual plane as opposed to representing a separation or break in the wafer 10. The face region 72a extends between the first side 20 and the plane 74. Accordingly, the support portion 70a extends a third thickness $t_3$ between the first side 20 and the mask face 52a.

Selected embodiments can improve the handling of the un-singulated semiconductor wafers during subsequent processing, including the process of singulating the semiconductor devices. For example, the support portion can provide a robust grid to support the individual thinned portions of the wafer. The inner surfaces formed by a grid-shaped region of the support portion can contain an adhesive (not shown) that is dispensed onto individual thinned surfaces for subsequently mounting individual semiconductor dies. Additionally, the support portion can provide a robust structure for dicing wafers to singulate individual semiconductor dies.

One example of a method for manufacturing semiconductor devices in any of FIGS. 2A-4D includes removing material from the mask and the semiconductor wafer and thereby forming (a) a support structure defined by remaining portions of the mask and portions of the semiconductor wafer, and (b) at least one thinned portion opposite the dies. The method further includes wet etching a surface of the thinned portion such that the support structure has a thickness within a range for subsequent wafer handling equipment after wet etching the surface of the thinned portion. The material can be removed from the mask and the semiconductor wafer by abrasively removing a central portion of the mask and the semiconductor wafer and thereby forming a single thinned portion across the semiconductor wafer opposite the dies. Alternatively, the material can be removed from the mask and the semiconductor wafer by (a) forming a pattern of openings in the mask in which individual openings are aligned with a corresponding die, and (b) removing material from the semiconductor wafer and thereby forming a plurality of thinned portions in the semiconductor wafer aligned with corresponding dies.

FIG. 5 is a flow chart showing a routine 100 for subsequently processing a thinned wafer 10 in accordance with embodiments of the present disclosure. The thinned portion of the wafer 10 is particularly fragile and therefore susceptible to damage during subsequent processing stages. Such subsequent processing stages can include, for example, wafer testing 110, interconnecting 120, and dicing 130. Wafer testing 110 can be used to verify that the dies 12 and/or routing have not been damaged during previous processing stages. Wafer testing 110 can include probing the wafer and typically increases the number of times that the wafer 10 is handled. Interconnecting 120 can be used to create wiring patterns for routing, redistribution layers, or through-substrate interconnects on the active face and/or the passive face of a wafer. Interconnecting 120 can include depositing metal films, applying resists to define wiring patterns on the metal films, and etching the metal films to form wiring patterns on and/or through the wafer. Dicing 130 singulates individual dies by cutting, scoring and breaking, or another suitable method for dividing a wafer. Subsequent processing can therefore produce thermal and/or physical stress in the wafer 10. To avoid damage due to such stress, support portions according to embodiments of the present disclosure provide a relatively robust structure to support thinned portions of semiconductor wafers.

Selected embodiments described above enable a thinned wafer to be handled without mounting the thinned wafer on a separate carrier or removing the thinned wafer from the carrier. In conventional processes, separate and additional tools are required to attach and detach the wafer to/from the separate carrier. This increases capital expenditures, increases the time, and limits the parameters of subsequent processing (e.g., higher temperature processes are limited because of the properties of existing adhesives). This eliminates the contamination caused by adhesives. This also allows the thinned wafer to undergo higher temperature processing because the temperature of the subsequent processes are not limited by the presence of an adhesive.

One embodiment of an un-singulated microelectronic device in accordance with the examples shown in FIGS. 1 to 5 comprises a semiconductor wafer and a mask. The semiconductor wafer includes an active side having a plurality of semiconductor dies, a backside spaced a first distance along an axis from the active side, and an outer perimeter edge extending between the active side and the backside. The semiconductor wafer also includes a thinned surface that is spaced a second distance along the axis from the active side and has an outer boundary spaced inwardly from the outer perimeter edge. The second distance is less than the first distance. The mask is positioned on the backside and has a mask thickness between the backside and a mask face.

From the foregoing, it will be appreciated that specific embodiments of the disclosure have been described herein for purposes of illustration, but that various modifications may be made without deviating from the spirit and scope of the disclosure. For example, structures and/or processes described in the context of particular embodiments may be combined or eliminated in other embodiments. In particular, the wafers described above with reference to particular embodiments can include one or more additional features or components, or one or more of the features described above can be omitted. Moreover, while advantages associated with certain embodiments of the disclosure have been described in the context of these embodiments, other embodiments may also exhibit such advantages, and not all embodiments need necessarily exhibit such advantages to fall within the scope of the disclosure. Accordingly, embodiments of the disclosure are not limited except as by the appended claims.

We claim:

1. A method of manufacturing semiconductor devices, comprising:
    fabricating a plurality of semiconductor dies at an active side of a semiconductor wafer, wherein the semiconductor wafer has a backside spaced from the active side by a first thickness and has an outer perimeter edge extending between the active side and the backside;
    depositing a mask on the backside of the semiconductor wafer, wherein the mask has a face spaced from the backside by a mask thickness;
    thinning a portion of the semiconductor wafer with the mask on the backside, wherein the thinned portion has a thinned surface spaced from the active side by a second thickness that is less than the first thickness; and
    etching the thinned surface;
    wherein the mask on the backside supports the thinned portion during subsequent manufacturing of the semiconductor devices.

2. The method of claim 1 wherein the thinning comprises a mechanical removal process.

3. The method of claim 1 wherein the mechanical removal process comprises grinding.

4. The method of claim 1 wherein the thinning comprises forming a support portion surrounding the thinned portion, wherein the support portion extends between the active side of the semiconductor wafer and the face of the mask.

5. The method of claim 4 wherein the at least an outer region of the support portion has a constant thickness before and after the etching procedure.

6. The method of claim 5 wherein etching the thinned surface includes undercutting the mask by removing semiconductor wafer material from underneath the mask.

7. The method of claim 1 wherein the etching removes semiconductor material from the thinned surface and thereby reduces scratches at the thinned surface.

8. The method of claim 1, further comprising back grinding the semiconductor wafer before depositing the mask to remove a thickness of semiconductor material from the semiconductor wafer equal to the mask thickness, whereby after depositing the mask the active side of the semiconductor wafer is spaced apart from the face of the mask by a distance equal to the first thickness of the semiconductor wafer before back grinding.

9. The method of claim 1, further comprising forming a plurality of openings in the mask, wherein individual mask openings are aligned with individual semiconductor dies.

10. The method of claim 1, further comprising handling the semiconductor wafer without mounting the thinned portion on a separate carrier.

11. A method of manufacturing semiconductor devices, comprising:

fabricating a plurality of semiconductor dies at an active side of a semiconductor wafer, wherein the semiconductor wafer has an initial thickness;

thinning the semiconductor wafer, wherein the thinned semiconductor wafer has a backside spaced from the active side by a first thickness that is less than the initial thickness;

depositing a mask on the backside of the thinned semiconductor wafer, wherein the mask has a face spaced from the backside by a mask thickness;

removing a central portion of the mask and the semiconductor wafer and thereby forming a thinned central portion having a second thickness less than the first thickness and a support portion surrounding the thinned portion, wherein the support portion has a thickness equal to the first thickness plus the mask thickness; and etching the thinned surface.

12. The method of claim 11 wherein thinning the semiconductor wafer comprises back grinding.

13. The method of claim 11 wherein removing the central portion of the mask and the semiconductor wafer comprises an abrasive mechanical process.

14. A method of manufacturing semiconductor devices, comprising:

fabricating a plurality of semiconductor dies at an active side of a semiconductor wafer, wherein the semiconductor wafer has a backside spaced from the active side by a first thickness;

depositing a mask on a backside of the semiconductor wafer, wherein the mask has a face spaced from the backside by a mask thickness;

forming a plurality of openings in the mask, wherein individual openings are aligned with individual semiconductor dies;

thinning the semiconductor wafer at a plurality of portions corresponding to the plurality of openings in the mask, wherein individual thinned portions have individual thinned surfaces spaced from the active side by a second thickness that is less than the first thickness.

15. The method of claim 14 wherein thinning the semiconductor comprises at least one of a mechanical removal procedure and an etching procedure.

16. The method of claim 14 wherein patterning forming the plurality of openings comprises forming a grid, wherein the grid extends between the active side of the semiconductor wafer and the face of the mask.

17. The method of claim 14, further comprising handling the semiconductor wafer without mounting the individual thinned portions on a separate carrier.

18. A method of manufacturing semiconductor devices on a semiconductor workpiece having a plurality of dies at an active side of a semiconductor wafer and a mask at a backside of the semiconductor wafer, the method comprising:

removing material from the mask and the semiconductor wafer and thereby forming (a) a support structure defined by remaining portions of the mask and portions of the semiconductor wafer, and (b) at least one thinned portion opposite the dies; and wet etching a surface of the thinned portion, wherein the support structure has a thickness for subsequent wafer handling equipment after wet etching the surface of the thinned portion.

19. The method of claim 18, wherein removing material from the mask and the semiconductor wafer comprises abrasively removing a central portion of the mask and the semiconductor wafer and thereby forming a single thinned portion across the semiconductor wafer opposite the dies.

20. The method of claim 18, wherein removing material from the mask and the semiconductor wafer comprises (a) forming a pattern of openings in the mask in which individual openings are aligned with a corresponding die, and (b) removing material from the semiconductor wafer and thereby forming a plurality of thinned portions in the semiconductor wafer aligned with corresponding dies.

21. The method of claim 20 wherein removing material from the semiconductor wafer comprises at least one of a mechanical removal process and etching.

22. An un-singulated microelectronic device for handling in semiconductor processing tools, comprising:

a semiconductor wafer including—
    an active side having a plurality of semiconductor dies;
    a backside spaced a first distance along an axis from the active side;
    an outer perimeter edge extending between the active side and the backside; and
    a thinned surface spaced a second distance along the axis from the active side, the second distance being less than the first distance, and the thinned surface having an outer boundary spaced inwardly from the outer perimeter edge;

a mask on the backside to support the thinned surface during subsequent handling by the semiconductor processing tools, the mask having a mask face spaced from the backside by a mask thickness, wherein the active side of the semiconductor wafer and the mask face are spaced apart by a distance for handling equipment of the semiconductor processing tools.

23. The device of claim 22 wherein the active side and the thinned surface include circular areas, the backside includes an annular area, and an annular inner surface extends between the mask and the thinned surface and defines an outer boundary of the thinned surface.

24. The device of claim 22, further comprising a support portion of the semiconductor wafer with the mask, wherein the support portion has a support thickness between the active side and the mask face.

25. The device of claim 24 wherein the support portion comprises a ring surrounding the thinned portion.

26. The device of claim 24 wherein the support portion comprises a grid including a plurality of openings, and individual openings are positioned over individual semiconductor dies.

* * * * *

UNITED STATES PATENT AND TRADEMARK OFFICE
CERTIFICATE OF CORRECTION

| | | |
|---|---|---|
| PATENT NO. | : 8,062,958 B2 | Page 1 of 1 |
| APPLICATION NO. | : 12/416609 | |
| DATED | : November 22, 2011 | |
| INVENTOR(S) | : Alan G. Wood et al. | |

It is certified that error appears in the above-identified patent and that said Letters Patent is hereby corrected as shown below:

In column 9, line 44, in Claim 16, after "wherein" delete "patterning".

Signed and Sealed this
Tenth Day of January, 2012

David J. Kappos
*Director of the United States Patent and Trademark Office*